United States Patent [19]
Chen et al.

[11] Patent Number: 6,080,659
[45] Date of Patent: Jun. 27, 2000

[54] METHOD TO FORM AN ALIGNMENT MARK

[75] Inventors: Chia-Chen Chen, Taipei; Shih-Che Wang, Hsinchu, both of Taiwan

[73] Assignee: United Microelectronics Corp., Hsinchu, Taiwan

[21] Appl. No.: 09/191,306

[22] Filed: Nov. 13, 1998

[51] Int. Cl.[7] .................................................. H01L 21/76
[52] U.S. Cl. ........................ 438/633; 438/401; 438/462; 438/637; 438/648; 438/672; 438/685
[58] Field of Search ..................................... 438/633, 401, 438/462, 629, 637, 648, 657, 672, 685, 688, 691–692, 699–703; 257/797

[56] References Cited

U.S. PATENT DOCUMENTS

| | | | |
|---|---|---|---|
| 5,747,369 | 5/1998 | Kantimahanti et al. | 438/241 |
| 5,858,854 | 1/1999 | Tsai et al. | 438/401 |
| 5,877,562 | 3/1999 | Sur et al. | 257/797 |
| 5,952,241 | 9/1999 | Baker et al. | 438/691 |
| 5,958,800 | 9/1999 | Yu et al. | 438/720 |

*Primary Examiner*—Charles Bowers
*Assistant Examiner*—Thanh Nguyen
*Attorney, Agent, or Firm*—Charles C. H. Wu; Charles C. H. Wu & Associates, APC

[57] ABSTRACT

A method to form a better quality of an alignment pattern includes several steps, first starts from forming a polysilicon layer on a semiconductor substrate. Next, most of a central portion of the polysilicon layer is removed to expose the substrate. Then, an oxide layer is formed over the substrate and is patterned to form an opening, which exposes the substrate. A W layer is deposited over the substrate and is planarized by WCMP process to form a W plug inside the opening. A metal layer is formed over the substrate. The alignment mark pattern is formed on the metal layer.

7 Claims, 3 Drawing Sheets

METHOD TO FORM AN ALIGNMENT MARK

BACKGROUND OF THE INVENTION

1. Field of the Invention

This invention relates to a method of forming an alignment mark, and more particularly to a method used in tungsten chemical mechanical polishing (WCMP) process to achieve a better alignment performance.

2. Description of Related Art

As the integration of a semiconductor device increases, the distance between interconnect lines is necessarily reduced and consequently the line width is also accordingly reduced. When the line width is reduced down to about 0.18 microns at a level of deep sub-half micron, a conventional planarization method of spin-on glass (SOG) technology is no longer suitable. Instead, a chemical mechanical polishing (CMP) technology is proposed to perform a global planarization and thereby plays a necessary role for very-large scale integrated (VLSI) fabrications. In particular, the WCMP process must become a necessary process in ultra-large semiconductor integration (ULSI) fabrications in the near future. However, the CMP process has a problem of alignment error, because as CMP process is applied to planarize the device elements on a semiconductor substrate, an alignment mark pattern may be smeared by planarization. This causes a difficulty in the alignment of photo-masks and results in alignment error, which consequently induces a pattern transfer error in subsequent fabrications. This alignment error is more obvious for fabrications including a tungsten (W) layer that are planarized by WCMP.

FIGS. 1A–1E are cross-sectional views schematically illustrating a convention fabrication flow of an alignment mark formed on the zero layer, according to a proposal from ASML company. In FIG. 1A, an alignment mark pattern 102 including a trench 104 with a depth of about 1200 Å is first formed on a semiconductor substrate 100 at an alignment mark region. The substrate 100 also includes a device element region (not shown). As it is necessary to form different material layers over the substrate 100 for fabrication processes, the different material layers are also formed on the alignment mark region. After a few fabrication processes on the device element region, a polysilicon layer 106 with a thickness of about 3000 Å is formed over the substrate 100. There is a trench 107 also formed on the polysilicon layer 106, corresponding to the trench 104 shown in FIG. 1A.

In FIG. 1C, an isolating layer 108 with an original thickness of about 17000 Å is formed over the polysilicon 106, in which the isolating layer 108 is employed for isolation in the device element region. Because the profile of the isolating layer 108 is usually not flat, a planarization process is performed to planarize the isolating layer 108. The isolating layer 108 has a thickness of about 10000 Å at the trench 107 shown in FIG. 1B after planarization. At this stage, trench structure disappears on the exposed surface of the isolating layer 108. It is necessary to remove the isolating layer 108 due to device fabrication. After removing the isolating layer 108, a tungsten (W) layer 110 with a thickness of about 5000 Å is formed over the substrate 100, as shown in FIG. 1D. The W layer 110 is for formation of W plug in the device element region. The exposed surface of the W layer 10 is not flat due to the under structure in the device element region and the trench 107 shown in FIG. 1B in the alignment mark region. A sharp dip also appears in the W layer 110 above the trench 107. A WCMP process is needed to planarize the W layer 110. In FIG. 1E, after the WCMP process, the W layer 110 becomes a W plug 110a filling the trench 107. Then a metal layer 112 with a thickness of about 5000 Å is formed over the substrate 100. Since the W plug 110a has almost the same height as the height of the polysilicon layer 106 after the WCMP process, the alignment mark pattern 102 shown in FIG. 1A very nearly no longer exists on the exposed surface of the metal layer 106. This causes an alignment failure of the subsequent photo-mask.

FIGS. 2A–2E are cross-sectional views schematically illustrating another conventional fabrication flow of an alignment mark formed on the non-zero layer, according to a proposal from ASML company and Nikon company. A semiconductor substrate 200 includes an alignment mark region as shown in FIG. 2A and includes a device element region (not shown). As it is necessary to form different material layers over the substrate 200 for fabrication processes, the different material layers are also formed on the alignment mark region. In FIG. 2A, after a few fabrication processes on the device element region, a polysilicon layer 202 with a thickness of about 3000 Å is formed over the substrate 200. In FIG. 2B, an oxide layer 204 serving as an isolating layer in the device element region is formed over the substrate 200 with an original thickness of about 17000 Å and is planarized to have a thickness of about 10000 Å. In FIG. 2C, in the alignment mark region 206, an opening 208 is formed by photolithography and etching. The opening 208 exposes the polysilicon layer 202 so that the depth of opening 208 is equal to the thickness of the oxide layer 204, about 10000 Å. This is the step height of the alignment mark. In FIG. 2C and FIG. 2D, a W plug 210 is formed by filling the opening 208. In order to form the W plug 210, a W layer (not shown) is formed over the substrate 200. Then a WCMP process is performed to polish out the W layer above the oxide layer 204. The residual W layer is the W plug 210 filled into the opening 208 but not fully filled due to WCMP process. The concave structure of the W plug 210 allows the alignment mark pattern to be maintained but with poor quality of step height. In FIG. 2E, a metal layer 212 with a thickness of about 5000 Å is formed over the substrate 200. The purpose of the metal layer 212 is to interconnect metal lines (not shown) in the device element region. The concave structure of the W plug 210 corresponding to the opening 208 shown in FIG. 2C also appears on the exposed surface of the metal layer 212. Here, it has even poorer step height, which is greatly reduced from the original step height of about 10000 Å. Thus, a subsequent alignment of photo-mask becomes difficult because there is no sufficient step height available for an alignment sensor to respond with a correct signal. An alignment error is therefore inevitable.

The above two conventional methods are proposed to form alignment patterns. Since the W plug is included in device fabrication, it is necessary to perform a WCMP process to globally planarize the substrate but it reduces the step height of the alignment pattern. The profile of the alignment pattern is degraded or even fully smeared out. The insufficient step height of the alignment mark pattern causes the alignment sensor to produce a signal that is too weak and results in alignment error, or even causes photomask alignment to be impossible. All these tremendously affect the subsequent fabrication of the device.

SUMMARY OF THE INVENTION

It is therefore an objective of the present invention to provide a method to form a better quality of an alignment pattern although a WCMP process is included in a fabrication method.

In accordance with the foregoing and other objectives of the present invention, a method to form a better quality of alignment pattern provided by the invention includes several steps, first starting with formation of a polysilicon layer on a semiconductor substrate. Next, most of a central portion of the polysilicon layer is removed to expose the substrate, in which place an alignment mark pattern is to be formed. Next, an oxide layer is formed over the substrate and is patterned to form an opening, which exposes the substrate and is the original alignment mark pattern. A W layer is deposited over the substrate and is planarized by WCMP process to expose the oxide layer. The residual W layer remaining after the WCMP process fills the opening as a W plug. Then a metal layer is formed over the substrate. Since the polysilicon layer at the central region is removed, the opening formed on this region includes a depth greater than a convention one, and the metal layer therefore respectively includes a mark opening with a step height greater than a conventional step height. This is greatly helpful for photomask alignment.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 3A:
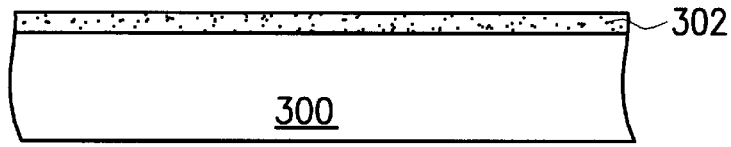
FIGS. 3A–3F are cross-sectional views schematically illustrating a fabrication flow of an alignment mark pattern including a tungsten chemical mechanical polishing process, according to a preferred embodiment of the invention.
Figure 3B:
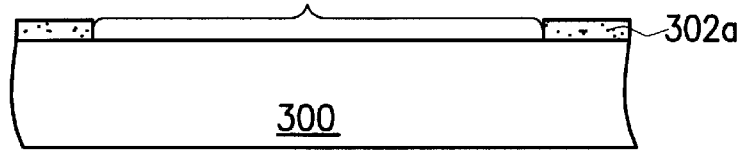
Figure 3C:
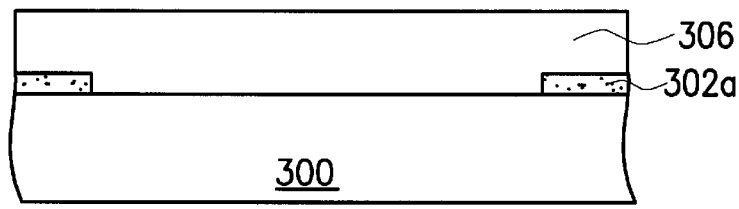

FIGS. 3A–3F are cross-sectional views schematically illustrating a fabrication flow of an alignment mark pattern including a tungsten chemical mechanical polishing process, according to a preferred embodiment of the invention. In FIG. 3A, a semiconductor substrate 300 includes an alignment mark region and includes a device element region (not shown). As it is necessary to form different material layers over the substrate 300 for fabrication processes, the different material layers are also formed on the alignment mark region. In FIG. 3A, after a few fabrication processes on the device element region, a polysilicon layer 302 with a thickness of about 3000 Å is formed over the substrate 300. In FIG. 3B, a central region of the polysilicon layer 302 is cleared out to form an alignment mark region 304, where the substrate 300 is exposed and the topography for the alignment mark is increased. The polysilicon layer 302 becomes a line-like polysilicon layer 302a. Then, an oxide layer 306 serving as an isolating layer in the device element region, is formed with an original thickness of about 17000 Å above the polysilicon layer 302a. The oxide layer 306 is then planarized by CMP process to have a thickness of about 10000 Å counted from the surface of the line-like polysilicon layer 302a to the surface of the oxide layer 306. Therefore the thickness of the oxide layer above the substrate 300 is about 13000 Å.

Figure 1A:
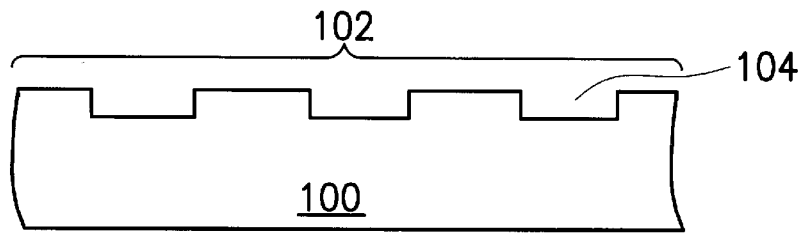
FIGS. 1A–1E are cross-sectional views schematically illustrating a convention fabrication flow of an alignment mark pattern formed on the zero layer, according to a proposal from ASML company.
Figure 1B:
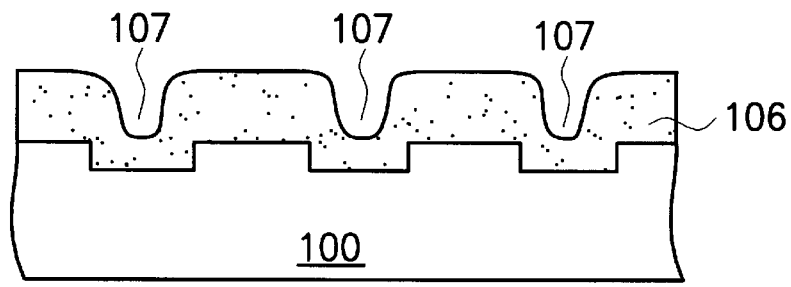
Figure 1C:
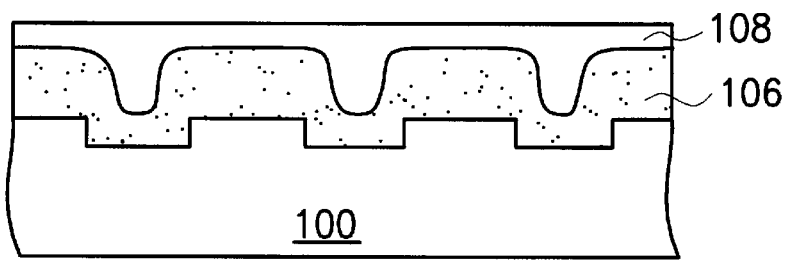
Figure 1D:
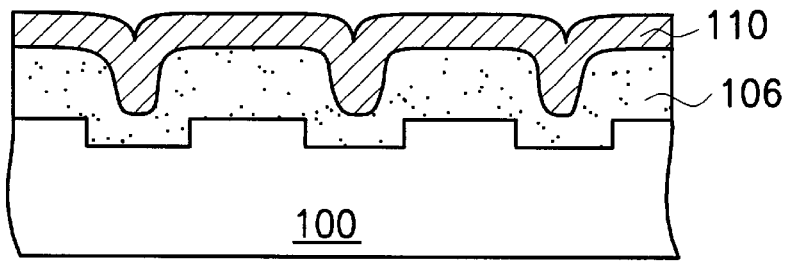
Figure 1E:
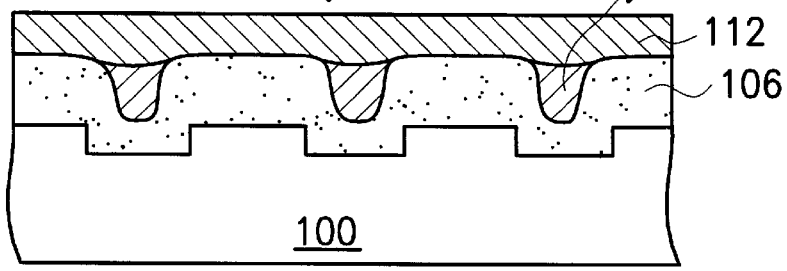
Figure 2A:
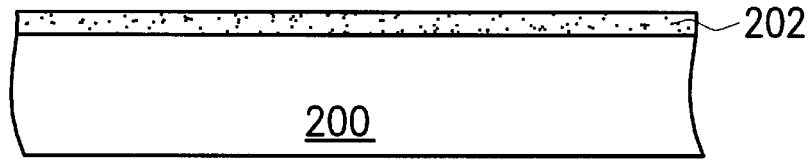
FIGS. 2A–2E are cross-sectional views schematically illustrating another convention fabrication flow of an alignment mark pattern formed on the non-zero layer, according to a proposal from ASML company and Nikon company.
Figure 2B:
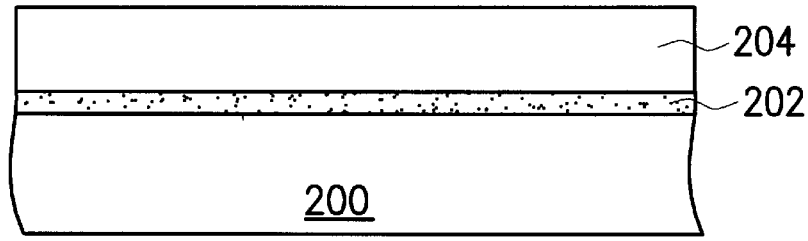
Figure 2C:
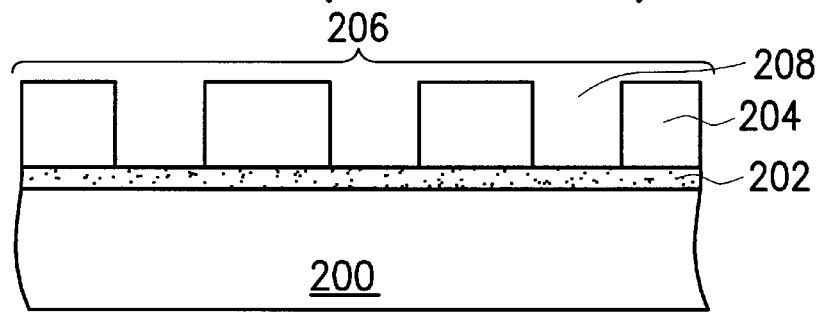
Figure 2D:
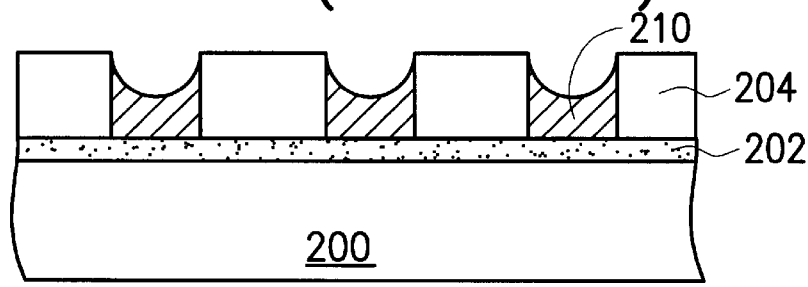
Figure 2E:
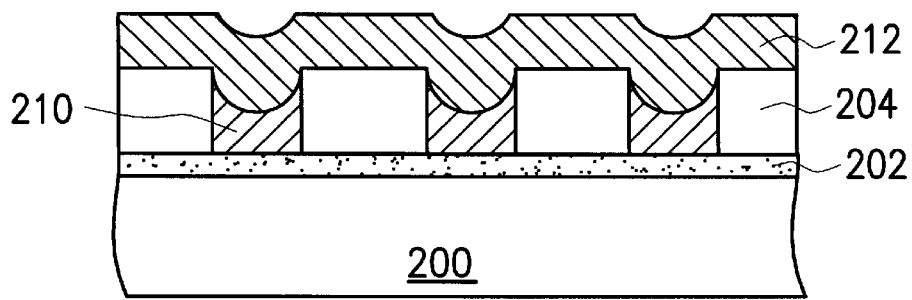
Figure 3D:
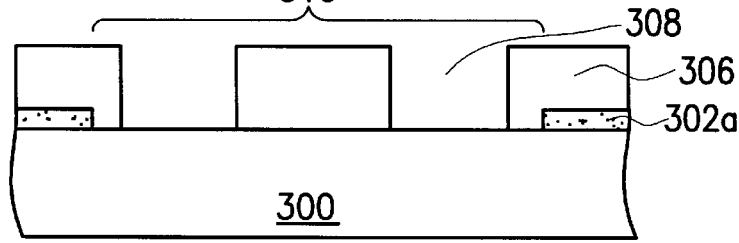
Figure 3E:
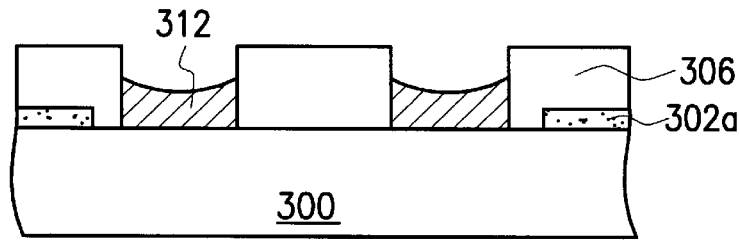
Figure 3F:
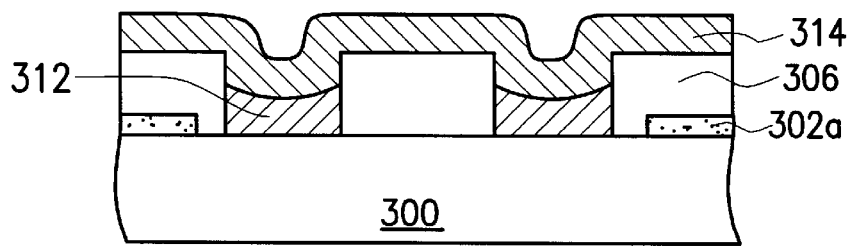

In FIG. 3D, an opening 308 is formed over the alignment region 310, which corresponds to the region 304 shown in FIG. 3B. The opening 308 exposes the substrate and has a depth of about 13000 Å, which is deeper than, for example, the conventional opening 208 shown in FIG. 2C by an extra 3000 Å. This is greatly helpful in producing a better step height as is to be seen below. In FIG. 3D and FIG. 3E, a W layer (not shown) is formed by chemical vapor deposition (CVD) over the substrate 300 with a thickness of about 5000 Å to fill the opening 308. After a WCMP process is performed on the W layer for planarization, the oxide layer 306 is exposed and a W plug 312, which is the residual W layer, is formed inside the opening 308. The W layer is mainly used to form a W plug (not shown) in the device element region so that the W plug 312 is formed as well. In FIG. 3E, a metal layer 314 with a thickness of about 5000 Å, serving as an interconnect metal line in the device element region, is formed over the substrate 300 by a sputtering process. The metal layer 314 and the W plug 312 are electrically coupled together. Since the depth of the opening 308 is deeper, the metal layer 314 includes a mark opening, which is above the opening 308 and is clearly seen with a sufficient step height.

In conclusion, the invention to form the alignment mark pattern is characterized by the following. Since the depth of the opening 308 is increased, the step height of the alignment mark pattern is sufficiently increased even after the WCMP process is performed. After a few layers with different purposes are formed over the alignment mark pattern, the pattern profile is maintained in a sufficiently good quality. It is no problem for the alignment sensor to produce a strong and correct signal for photo-mask alignment. The production yield can be maintained.

According to experimental results of the invention, the maximum alignment error estimated at three standard deviations is 60 microns. This means that there is only a probability of 0.27% that it will exceed the 60 microns of the alignment.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method to form an alignment mark pattern, which is formed by including a tungsten chemical mechanical polishing (WCMP) process, the method comprising:

forming a polysilicon over a semiconductor substrate;

clearing out a portion of the polysilicon layer to exposes the substrate, wherein the exposed substrate region is an alignment mark region;

forming an oxide layer over the substrate;

patterning the oxide layer to form an opening in the exposed substrate region to expose the substrate;

forming a tungsten (W) plug inside the opening; and forming a metal layer over the substrate.

2. The method of claim 1, wherein the polysilicon layer has a thickness of about 3000 Å.

3. The method of claim 1, wherein the oxide layer has a thickness of about 13000 Å at the alignment mark region, and has a thickness of about 10000 Å above the residual polysilicon layer.

4. The method of claim 1, wherein the depth of the opening formed on the oxide layer has a thickness of about 13000 Å.

5. The method of claim 1, wherein the step of forming the W plug further comprises:
   forming a W layer over the substrate to fully fill the opening; and
   performing a W chemical mechanical polishing (WCMP) process to planarize the substrate, wherein the oxide layer is exposed, and the residual W layer inside the opening is the W plug.

6. The method of claim 5, wherein the W layer is formed by chemical vapor deposition (CVD) with a thickness of about 5000 Å but the opening is fully filled.

7. The method of claim 1, wherein the metal layer is formed by a sputtering process to have a thickness of about 5000 Å.

* * * * *